US012757579B2

(12) United States Patent
Hu et al.

(10) Patent No.: US 12,757,579 B2
(45) Date of Patent: Oct. 6, 2026

(54) DISPLAY PANEL AND DISPLAY APPARATUS

(71) Applicant: Hefei Visionox Technology Co., Ltd., Hefei (CN)

(72) Inventors: Junlin Hu, Hefei (CN); Rubo Xing, Hefei (CN); Xingxing Yang, Hefei (CN); Yiming Jia, Hefei (CN)

(73) Assignee: Hefei Visionox Technology Co., Ltd., Hefei (CN)

( * ) Notice: Subject to any disclaimer, the term of this patent is extended or adjusted under 35 U.S.C. 154(b) by 455 days.

(21) Appl. No.: 18/359,286

(22) Filed: Jul. 26, 2023

(65) Prior Publication Data

US 2024/0023380 A1 Jan. 18, 2024

Related U.S. Application Data

(63) Continuation of application No. PCT/CN2022/089221, filed on Apr. 26, 2022.

(30) Foreign Application Priority Data

Aug. 2, 2021 (CN) ........................ 202110880383.6

(51) Int. Cl.
*H10K 59/122* (2023.01)
*H10K 59/13* (2023.01)
*H10K 59/35* (2023.01)

(52) U.S. Cl.
CPC .......... *H10K 59/122* (2023.02); *H10K 59/13* (2023.02); *H10K 59/353* (2023.02)

(58) Field of Classification Search
CPC .......................... H10K 59/122; H10K 59/353
(Continued)

(56) References Cited

U.S. PATENT DOCUMENTS

2012/0181525 A1* 7/2012 Sugimoto ............. H05B 33/12
257/40
2013/0134449 A1* 5/2013 Chen ................. H10K 59/1795
438/34
(Continued)

FOREIGN PATENT DOCUMENTS

CN 207116483 U 3/2018
CN 208488619 U 2/2019
(Continued)

OTHER PUBLICATIONS

English Machine Translation of CN 211238258 (Year: 2020).*
(Continued)

*Primary Examiner* — Dzung Tran
(74) *Attorney, Agent, or Firm* — Maier & Maier, PLLC

(57) ABSTRACT

A display panel and a display apparatus, the display panel includes: a base plate; a pixel electrode layer arranged on the base plate and including a plurality of pixel electrodes distributed in an array; and a pixel definition layer located at a side of the pixel electrode layer away from the base plate, the pixel definition layer including a plurality of first isolation portions distributed at intervals, each of the first isolation portions being ring-shaped and surrounding and defining a pixel opening, and an edge of a first orthographic projection of the pixel electrode on the base plate being within a second orthographic projection of the first isolation portion on the base plate.

18 Claims, 4 Drawing Sheets

(58) Field of Classification Search
USPC .............................................................. 257/40
See application file for complete search history.

(56) References Cited

U.S. PATENT DOCUMENTS

| | | | | |
|---|---|---|---|---|
| 2015/0001485 | A1* | 1/2015 | Kang | H10K 59/122 438/35 |
| 2017/0141169 | A1* | 5/2017 | Sim | H10K 59/122 |
| 2020/0006697 | A1 | 1/2020 | Jung | |
| 2020/0075698 | A1 | 3/2020 | Yang et al. | |
| 2021/0343803 | A1 | 11/2021 | Cheng et al. | |

FOREIGN PATENT DOCUMENTS

| | | | |
|---|---|---|---|
| CN | 110783387 | A | 2/2020 |
| CN | 110875366 | A | 3/2020 |
| CN | 109599414 | B | 6/2020 |
| CN | 211238258 | U | 8/2020 |
| CN | 111739924 | A | 10/2020 |
| CN | 113097417 | A | 7/2021 |
| CN | 113488602 | A | 10/2021 |
| CN | 113690278 | A | 11/2021 |
| JP | 2010010098 | A | 1/2010 |
| JP | 2020532820 | A | 11/2020 |
| KR | 1020200027600 | A | 3/2020 |
| WO | 2010087238 | A1 | 8/2010 |
| WO | 2016098758 | A1 | 6/2016 |

OTHER PUBLICATIONS

Office Action issued on Jun. 4, 2024, in corresponding Japanese Application No. 2023-546283, 8 pages.
Office Action issued on Jan. 16, 2024, in corresponding Chinese Application No. 202110880383.6, 6 pages.
International Search Report issued on Jul. 11, 2022, in corresponding International Application No. PCT/CN2022/089221, 4 pages.
Office Action issued on May 16, 2025, in corresponding Korean Application No. 10-2023-7026208, 10 pages.

* cited by examiner

DISPLAY PANEL AND DISPLAY APPARATUS

CROSS-REFERENCE TO RELATED APPLICATIONS

The present application is a continuation of International Application No. PCT/CN2022/089221 filed on Apr. 26, 2022, which claims priority to Chinese Patent Application No. 202110880383.6 filed on Aug. 2, 2021, both of which are incorporated herein by reference in their entireties.

FIELD

The present application relates to the technical field of display devices, and in particular, to a display panel and a display apparatus.

BACKGROUND

With the rapid development of electronic devices, demands of users for the screen-to-body ratio are higher and higher, resulting in that the full-screen display of electronic devices attracts more and more attention in the industry. In the field of smart phones, a higher and higher screen-to-body ratio is pursued for the product. Traditional electronic devices such as a cell phone and a tablet computer need to integrate a front camera, a telephone receiver, an infrared sensing component and the like. In the prior art, a notch or a hole may be formed in the display panel so that external light can enter the photosensitive component under the screen through the notch or the hole. Nonetheless, these electronic devices do not achieve a real full-screen display, and cannot display an image in all areas of the entire screen. For example, the area corresponding to the front camera cannot display the image.

Therefore, the technology of under-screen photosensitive component are developed. However, due to the diffraction caused by the periodical pixel arrangement of the display panel, light diffraction (e.g., starburst effect) may occur under strong light, and the imaging quality is affected.

SUMMARY

Embodiments of the present application provide a display panel and a display apparatus, aiming for improving the display effect of the display panel.

Embodiments of a first aspect of the present application provide a display panel including: a base plate; a pixel electrode layer arranged on the base plate and including a plurality of pixel electrodes distributed in an array; and a pixel definition layer located at a side of the pixel electrode layer away from the base plate, the pixel definition layer including a plurality of first isolation portions distributed at intervals, each of the first isolation portions being ring-shaped and surrounding and defining a pixel opening, and an edge of a first orthographic projection of the pixel electrode on the base plate being within a second orthographic projection of the first isolation portion on the base plate.

According to the implementations of the first aspect of the present application, the pixel definition layer further includes second isolation portions each filled between adjacent first isolation portions, and a light transmittance of the first isolation portion is less than a light transmittance of the second isolation portion.

Embodiments of a second aspect of the present application further provide a display apparatus including the display panel according to any one of the embodiments of the first aspect.

According to the implementations of the second aspect of the present application, the display apparatus further includes a photosensitive component spaced apart from the pixel electrode, and a light transmittance function of the first isolation portion satisfies the following equation:

$$t_2(x_o, y_o) = F^{-1}\left\{\frac{t_1(x_o, y_o) * \sum_{n=1}^{N}\delta(x_o-\varepsilon_n, y_o-\eta_n)}{\left|\sum_{n=1}^{N}\exp[-j2\pi(f_x\varepsilon_n + f_y\eta_n)]\right|^2}\right\} - t_1(x_o, y_o)$$

in which $(x_0,y_0)$ is a coordinate of a position of the first isolation portion, $F^{-1}$ represents inverse Fourier transform, $\varepsilon_n$ is a distance from a position of an n-th first isolation portion to an axis $x_0$, $\eta_n$ is a distance from the position of the n-th first isolation portion to an axis $y_0$, $f_x=x/(\lambda\times z)$, $f_y=y/(\lambda\times z)$, and z is a distance from the pixel electrode to the photosensitive component.

In the display panel according to the embodiments of the present application, the display panel includes the base plate, the pixel electrode layer and the pixel definition layer. The pixel electrode layer includes a plurality of pixel electrodes distributed in an array, and the pixel electrodes are configured to drive the display panel to display. The pixel definition layer includes a plurality of first isolation portions distributed at intervals, and the first isolation portion encloses the pixel opening. The edge of the first orthographic projection of the pixel electrode on the base plate is within the second orthographic projection of the first isolation portion on the base plate, that is, a gap between two adjacent isolation portions is within a gap between two adjacent pixel electrodes. In addition, the first isolation portion has a low light transmittance and can block a part of the light passing between two adjacent pixel electrodes, therefore the first isolation portion can reduce the diffraction between two adjacent pixel electrodes, thereby improving the display effect of the display panel.

DETAILED DESCRIPTION

For a better understanding of the present application, a display panel and a display apparatus according to the embodiments of the present application will be described in detail below with reference to FIG. 1 to FIG. 6.

Figure 1:
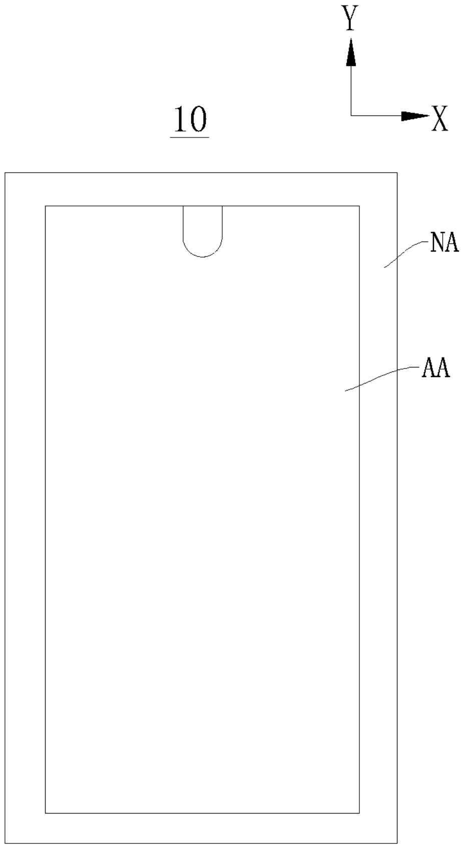
FIG. 1 shows a schematic structural diagram of a display panel according to embodiments of a first aspect of the present application.

As shown in FIG. 1, a display panel 10 includes a display area AA and a non-display area NA arranged surrounding the display area AA. In other embodiments, the display panel 10 may not include the non-display area NA.

Optionally, the display area AA includes a first display area and a second display area, a light transmittance of the first display area is greater than a light transmittance of the second display area, and the first display area is configured to implement the light transmission and display function for the display panel 10. A photosensitive device may be arranged at the back-light side of the display panel 10, and may acquire light information via the first display area.

Figure 2:
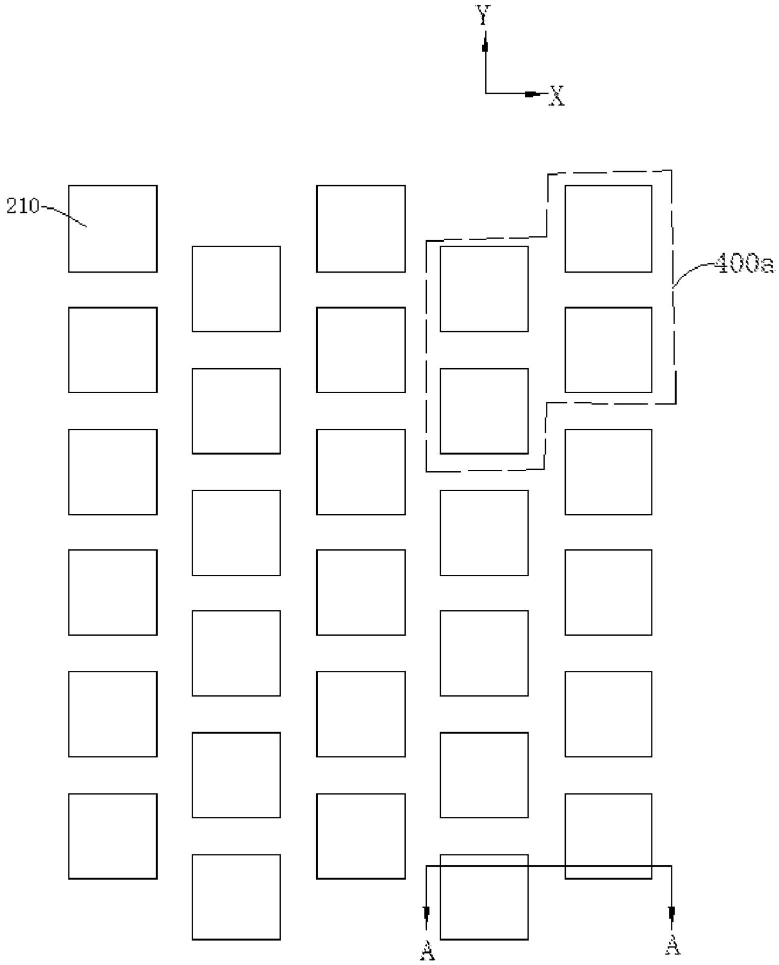
FIG. 2 shows a partial enlarged schematic structural diagram of the display panel in FIG. 1.
Figure 3:
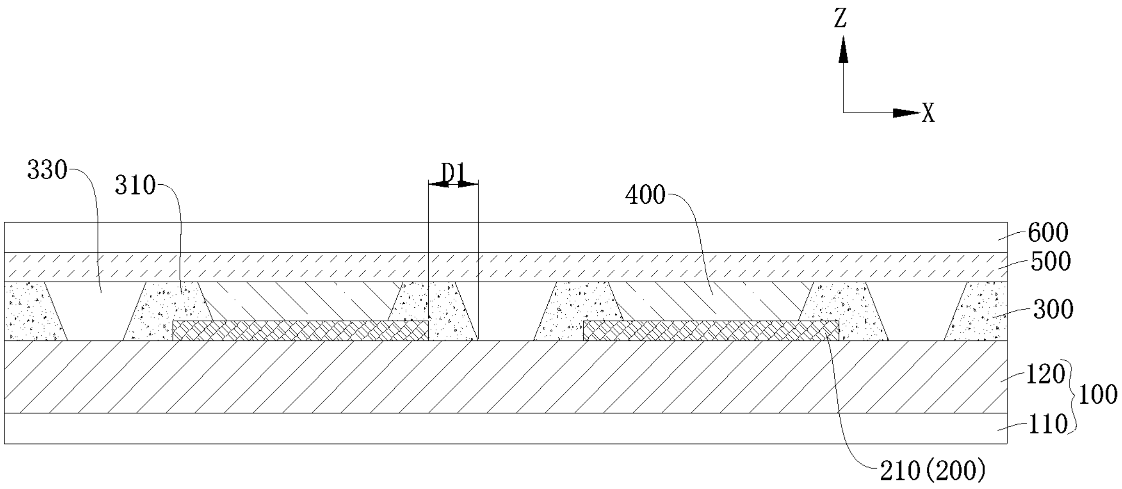
FIG. 3 shows a cross-sectional view along A-A in FIG. 2.
Figure 4:
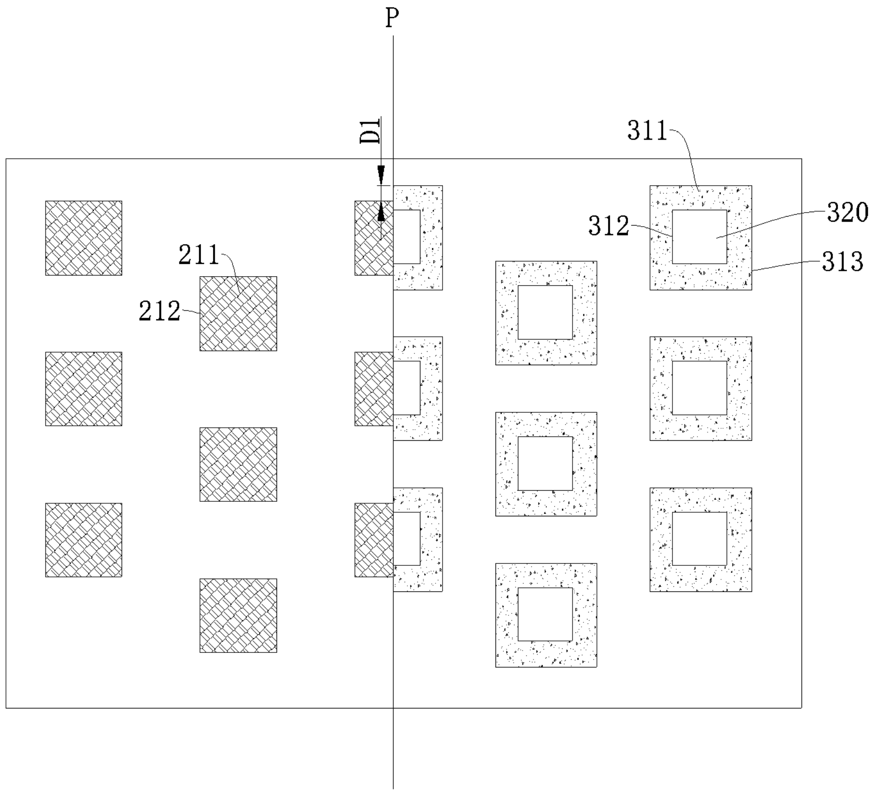
FIG. 4 shows a top schematic structural diagram of pixel electrodes and first isolation portions in a display panel according to embodiments of a first aspect of the present application.

As shown in FIG. 2 to FIG. 4, the display panel 10 according to embodiments of a first aspect of the present application includes a base plate 100, a pixel electrode layer 200 arranged on the base plate 100, and a pixel definition layer 300 located at a side of the pixel electrode layer 200 away from the base plate 100. The pixel electrode layer 200 includes a plurality of pixel electrodes 210 distributed in an array. The pixel definition layer 300 includes a plurality of first isolation portions 310 distributed at intervals, each of the first isolation portions 310 is ring-shaped and surrounds and defines a pixel opening 320, and an edge of a first orthographic projection 211 of the pixel electrode 210 on the base plate 100 is within a second orthographic projection 311 of the first isolation portion 310 on the base plate 100.

As shown in FIG. 4, a top schematic structural diagram of the pixel electrode 210, that is, a schematic structural diagram of a distribution of the first orthographic projection 211, is shown on a left side of the axis P in FIG. 4. A top schematic structural diagram of the first isolation portion 310, that is, a schematic structural view of a distribution of the second orthographic projection 311, is shown on a right side of the axis Pin FIG. 4.

In the display panel 10 according to the embodiments of the present application, the display panel 10 includes the base plate 100, the pixel electrode layer 200 and the pixel definition layer 300. The pixel electrode layer 200 includes a plurality of pixel electrodes 210 distributed in an array, and the pixel electrodes 210 are configured to drive the display panel 10 to display. The pixel definition layer 300 includes a plurality of first isolation portions 310 distributed at intervals, and the first isolation portion 310 encloses the pixel opening 320. The edge of the first orthographic projection 211 of the pixel electrode 210 on the base plate 100 is within the second orthographic projection 311 of the first isolation portion 310 on the base plate 100, that is, a gap between two adjacent isolation portions 310 is within a gap between two adjacent pixel electrodes 210. In addition, the first isolation portion 310 has a low light transmittance and can block a part of the light passing between two adjacent pixel electrodes 210, therefore the first isolation portion 310 can reduce the diffraction between two adjacent pixel electrodes, thereby improving the display effect of the display panel 10.

Optionally, the light transmittance of the first isolation portion 310 is equal to or less than 70%, that is, the first isolation portion 310 has a low light transmittance and can further reduce the diffraction between two adjacent pixel electrodes, thereby improving the display effect of the display panel 10.

In addition, in the embodiments according to the present application, it is not necessary to change the shape of the pixel opening 320 or add a new film layer, the method for manufacturing the display panel 10 can be simplified, thereby improving the efficiency for manufacturing the display panel 10.

The base plate 100 includes, for example, a substrate 110 and a driving device layer 120 arranged on the substrate 110, and the driving device layer 120 includes structures such as driving circuits. Optionally, the display panel 10 further includes a second electrode layer located at a side of the pixel definition layer 300 away from the base plate 100, and the second electrode layer includes, for example, a common electrode 500. Optionally, the display panel 10 further includes an encapsulation layer 600 located at a side of the common electrode 500 away from the pixel definition layer 300.

In some optional embodiments, the pixel definition layer 300 further includes second isolation portions 330 each filled between adjacent first isolation portions 310, and a light transmittance of the first isolation portion 310 is less than a light transmittance of the second isolation portion 330.

In these optional embodiments, by arranging the second isolation portions 330, the flatness of a side of the pixel definition layer 300 away from the base plate 100 can be ensured, so as to ensure the flatness of the common electrode 500, thereby avoiding a poor connection of the common electrode 500 caused by the non-flatness of the pixel definition layer 300. In addition, the light transmittance of the second isolation portion 330 is greater than the light transmittance of the first isolation portion 310, the second isolation portion 330 has a greater light transmittance and can increase the light transmittance of the display panel 10, thereby facilitating the photosensitive component to acquire light information at the back-light side of the display panel 10.

Optionally, as shown in FIG. 3, the display panel 10 further includes light-emitting units 400 emitting lights of different colors, each of the light-emitting units 400 is located in one pixel opening 320. Optionally, a plurality of light-emitting units 400 are arranged in rows and columns along a row direction (direction X in FIG. 2) and a column direction (direction Y in FIG. 2). The light-emitting unit 400, the pixel electrode 210 and the common electrode 500 form a sub-pixel, and the pixel electrode 210 and the common electrode 500 collectively drive the light-emitting unit 400 to emit light.

Figure 5:
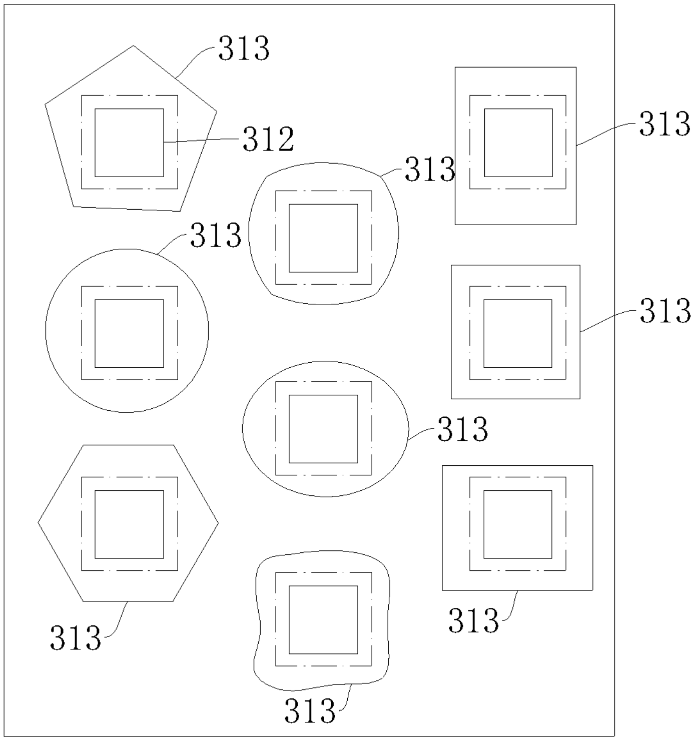
FIG. 5 shows a schematic structural diagram of first isolation portions in a display panel according to embodiments of a first aspect of the present application.

In some optional embodiments, as shown in FIG. 4 and FIG. 5, the second orthographic projection 311 includes second inner edges 312 facing the pixel opening 320 and second outer edges 313 away from the pixel opening 320, the second outer edges 313 enclose an isolation area, and isolation areas where at least two light-emitting units 400 emitting lights of a same color are located are of different sizes. The isolation area where the light-emitting unit 400 is located refers to an isolation area where the orthographic projection of the light-emitting unit 400 on the base plate 100 is located.

In these optional embodiments, both the first orthographic projection 211 and the light-emitting unit 400 are located within the isolation area. Isolation areas where the light-emitting units 400 of a same color are located are of different sizes, so as to reduce the light diffraction between the light-emitting units 400 of a same color, thereby further improving the display effect of the display panel 10.

In some optional embodiments, referring to FIG. 3 and FIG. 4 together, the first orthographic projection 211 includes first outer edges 212, for the first orthographic projection 211 within the isolation area, a distance between the second outer edge 313 and the first outer edge 212 is a first distance D1 greater than 0. Therefore, it is ensured that the first isolation portion 310 can better cover the edges of the pixel electrode 210 and can block at least a part of the light passing through a gap between two adjacent pixels, so as to further reduce the diffraction between two adjacent pixel electrodes 210, thereby improving the display effect of the display panel 10.

Optionally, the first distances D1 corresponding to at least two of the pixel electrodes 210 are different. The first distance D1 corresponding to the pixel electrode 210 refer to a distance between the first outer edge 212 of the first orthographic projection 211 of the pixel electrode 210 on the base plate 100 and the second outer edge 313 of the second orthographic projection 311 of the first isolation portion 310 arranged surrounding this pixel electrode 210 on the base plate 100.

In these optional embodiments, the first distances D1 corresponding to at least two of the pixel electrodes 210 are different, so that the first isolation portions 310 corresponding to the at least two pixel electrodes 210 can still be of different shapes and different sizes even if the at least two pixel electrodes 210 are of same shape and same size, regular gaps between adjacent first isolation portions 310 can be avoided to reduce the diffraction, thereby improving the display effect of the display panel 10.

In some optional embodiments, the first distances D1 corresponding to at least two light-emitting units 400 of a same color are different. The first distance D1 corresponding to the light-emitting unit 400 refer to a distance between the first outer edge 212 of the first orthographic projection 211 of the pixel electrode 210 located at a side of this light-emitting unit 400 facing the base plate 100 and the second outer edge 313 of the second orthographic projection 311 of the first isolation portion 310 arranged surrounding this pixel electrode 210.

In these optional embodiments, the light-emitting units 400 of a same color refer to the light-emitting units 400 emitting lights of a same color. The first distances D1 corresponding to the light-emitting units 400 of a same color are different, so that the light diffraction between the light-emitting units 400 of a same color can be reduced, thereby further improving the display effect of the display panel 10.

Optionally, the first distances D1 corresponding to two adjacent light-emitting units 400 emitting lights of a same color are different. Generally, the pixel electrodes 210 corresponding to a same light-emitting unit 400 are of a same shape and a same size, and when the first distances D1 corresponding to two adjacent light-emitting units 400 emitting lights of a same color are different, the light diffraction between the pixel electrodes 210 corresponding to two adjacent light-emitting units 400 emitting lights of a same color can be reduced, thereby improving the display effect of the display panel 10.

The two adjacent light-emitting units 400 emitting lights of a same color may be two adjacent light-emitting units 400 emitting lights of a same color along the row direction or two adjacent light-emitting units 400 emitting lights of a same color along the column direction, or may include two adjacent light-emitting units 400 emitting lights of a same color along the row direction and two adjacent light-emitting units 400 emitting lights of a same color along the column direction.

As shown in FIG. 2 to FIG. 4, a plurality of the light-emitting units 400 emitting lights of different colors are combined to form a repeating unit 400*a*, a plurality of repeating units 400*a* are distributed in an array in the display panel 10, that is, the pixel arrangement structure of the display panel 10 is obtained by shifting the repeating unit 400*a* along the row direction and the column direction.

In some optional embodiments, the first distances D1 corresponding to the light-emitting units 400 in at least two of the repeating units 400*a* are different. The first distance D1 corresponding to the light-emitting unit 400 in the repeating unit 400*a* refers to, in the repeating unit 400*a*, a distance between the first outer edge 212 of the first orthographic projection 211 of the pixel electrode 210 located at a side of the light-emitting unit 400 facing the base plate 100 and the second outer edge 313 of the second orthographic projection 311 of the first isolation portion 310 surrounding this pixel electrode 210. The first distances D1 corresponding to the light-emitting units 400 in at least two of the repeating units 400*a* are different may mean that the first distances D1 corresponding to one or more light-emitting units 400 in at least two of the repeating units 400*a* are different, or the first distances D1 corresponding to all light-emitting units 400 in at least two of the repeating units 400*a* are different.

Optionally, the first distances D1 corresponding to the various light-emitting units 400 within one repeating unit 400*a* are equal, so that the manufacturing difficulty of the display panel 10 can be reduced, thereby facilitating the manufacturing of the display panel 10.

Optionally, the first distances D1 corresponding to the light-emitting units 400 in adjacent repeating units 400*a* are different, so that the diffraction between two adjacent repeating units 400*a* can be reduced, thereby improving the display effect of the display panel 10.

Herein, the two adjacent repeating units 400*a* may be two adjacent repeating units 400*a* along the row direction or two adjacent repeating units 400*a* along the column direction, or may include two adjacent repeating units 400*a* along the row direction and two adjacent repeating units 400*a* along the column direction.

Referring to FIG. 5, positions of the pixel electrodes 210 are illustrated by dot dash lines.

As shown in FIG. 2 and FIG. 5, in some optional embodiments, the isolation areas corresponding to at least two of the pixel electrodes 210 are of different shapes, so that the diffraction between the pixel electrodes 210 can be further reduced, thereby improving the display effect. As shown in FIG. 5, the shape of the isolation area may be a pentagon, a hexagon, a round, an oval, a rectangle, a square, or a combination thereof.

In some optional embodiments, the isolation areas corresponding to the light-emitting units 400 in at least two of the repeating units 400*a* are of different shapes. The isolation area corresponding to the light-emitting unit 400 in the repeating unit 400*a* refer to an isolation area where the light-emitting unit 400 in the repeating unit 400*a* is located. The isolation areas corresponding to the light-emitting units 400 in at least two of the repeating units 400*a* are different may mean that the isolation areas where one or more light-emitting units 400 in at least two of the repeating units 400*a* are located are different, or the isolation areas where all light-emitting units 400 in at least two of the repeating units 400*a* are located are different.

Optionally, the isolation areas corresponding to the various light-emitting units 400 within the repeating unit 400*a* are of a same shape. That is, the isolation areas where the various light-emitting units 400 within the repeating unit 400*a* are located are of a same shape, so that the manufacturing difficulty for the display panel 10 can be reduced, thereby facilitating the manufacturing of the display panel 10.

The isolation areas corresponding to the light-emitting units 400 in adjacent repeating units 400*a* are of different shapes, so that the diffraction between two adjacent repeating units 400_a_ can be reduced, thereby improving the display effect of the display panel 10.

In some optional embodiments, the isolation areas where at least two light-emitting units 400 emitting lights of a same color are located are of different shapes. For example, the isolation areas where two adjacent light-emitting units 400 emitting lights of a same color are located are of different shapes, so that the diffraction between the pixel electrodes 210 corresponding to two adjacent light-emitting units 400 can be reduced, thereby improving the display effect of the display panel 10.

As an optional embodiment, for example, the first distances D1 in the display panel 10 may have two, three or more values. For example, the first distances D1 have nine values, i.e., x1, x2, x3, x4, x5, x6, x7, x8 and x9, which are not equal to each other. Optionally, the first distances D1 corresponding to the light-emitting units 400 in nine adjacent repeating units 400_a_ are the above x1, x2, x3, x4, x5, x6, x7, x8 and x9, respectively, the first isolation portions 310 corresponding to the light-emitting units 400 in the nine repeating units 400_a_ are regarded as a group, and the pixel definition layer 300 includes a plurality of groups of the first isolation portions 310. This nine adjacent repeating units 400_a_ may be arranged in sequence along the row direction, or arranged in sequence along the column direction, or arranged in three rows and three columns. Alternatively, the first distances D1 corresponding to nine adjacent light-emitting units 400 emitting lights of a same color are the above x1, x2, x3, x4, x5, x6, x7, x8 and x9, respectively, the first isolation portions 310 corresponding to the nine adjacent light-emitting units 400 are regarded as a group, and the pixel definition layer 300 includes a plurality of groups of the first isolation portions 310. This nine adjacent light-emitting units 400 may be arranged in sequence along the row direction, or arranged in sequence along the column direction, or arranged in three rows and three columns.

As another optional embodiment, for example, the isolation areas in the display panel 10 have two, three or more shapes, for example, the isolation areas have nine shapes, i.e., s1, s2, s3, s4, s5, s6, s7, s8 and s9, which respectively represent different shapes and are different from each other. Optionally, the shapes of the isolation areas corresponding to the light-emitting units 400 in nine adjacent repeating units 400_a_ are the above s1, s2, s3, s4, s5, s6, s7, s8 and s9, respectively, the first isolation portions 310 corresponding to the light-emitting units 400 in the nine repeating units 400_a_ are regarded as a group, and the pixel definition layer 300 includes a plurality of groups of the first isolation portions 310. This nine adjacent repeating units 400_a_ may be arranged in sequence along the row direction, or arranged in sequence along the column direction, or arranged in three rows and three columns. Alternatively, the first distances D1 corresponding to nine adjacent light-emitting units 400 emitting lights of a same color are the above s1, s2, s3, s4, s5, s6, s7, s8 and s9, respectively, the first isolation portions 310 corresponding to the nine adjacent light-emitting units 400 are regarded as a group, and the pixel definition layer 300 includes a plurality of groups of the first isolation portions 310. This nine adjacent light-emitting units 400 may be arranged in sequence along the row direction, or arranged in sequence along the column direction, or arranged in three rows and three columns.

Embodiments of the second aspect of the present application provide a display apparatus including the display panel 10 according to any one of the embodiments of the first aspect. Since the display apparatus according to the embodiments of the second aspect of the present application includes the display panel 10 according to any one of the embodiments of the first aspect, the display apparatus according to the embodiments of the second aspect of the present application has the beneficial effects of the display panel 10 according to any one of the embodiments of the first aspect, which will not be repeated herein.

The display apparatus according to the embodiments of the present application includes, but is not limited to, a mobile phone, a personal digital assistant (PDA), a tablet computer, e-book, a television, an entrance guard, a smart fixed-line phone, a console and other devices with display function.

Optionally, the display apparatus further includes a photosensitive component spaced apart from the pixel electrode 210. The light diffraction between adjacent pixel electrodes 210 will affect the light information acquired by the photosensitive component.

Figure 6:
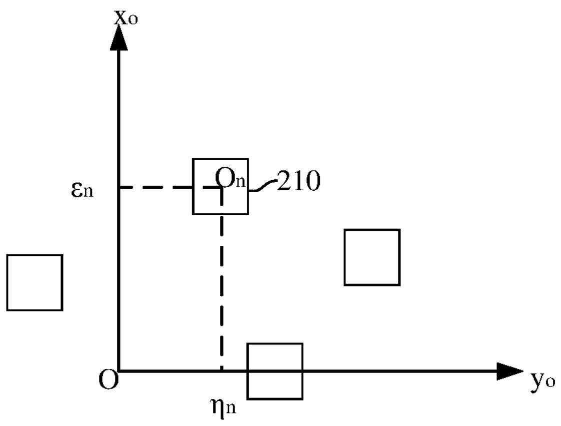
FIG. 6 shows a coordinate reference diagram.

Referring to FIG. 6, which shows a coordinate reference diagram.

As shown in FIG. 6, it is assumed that a central point $0_n(\varepsilon_n,\eta_n)$ of the pixel electrode 210 is taken as the position of the pixel electrode 210, that is, the central point $0_n(\varepsilon_n,\eta_n)$ of the pixel electrode 210 represents the position of the pixel electrode 210. The light transmittance function $t_1(x_0,y_0)$ of the pixel electrodes 210 of the entire display panel 10 may be represented as a combination of the light transmittances of N pixel electrodes 210, that is, the light transmittance function $t_1(x_0,y_0)$ of the pixel electrodes 210 is:

$$t_1(x_o, y_o) = \sum_{n=1}^{N} t_c(x_o - \varepsilon_n, y_o - \eta_n)$$

in which $\varepsilon_n$ is a distance from an n-th position to an axis $x_0$, and $\eta_n$ is a distance from the n-th position to an axis $y_0$. With the sifting property of the δ function, the light transmittance function $t_1(x_0,y_0)$ of the pixel electrodes 210 can be obtained as:

$$t_1(x_o, y_o) = t_c(x_o, y_o) * \sum_{n=1}^{N} \delta(x_o - \varepsilon_n, y_o - \eta_n) \tag{1}$$

Similarly, since the position of the first isolation portion 310 corresponds to the position of the pixel electrode 210, it is assumed that the central point of the first isolation portion 310 overlaps the central point of the pixel electrode 210, then the central point $0_n(\varepsilon_n,\eta_n)$ of the pixel electrode 210 may be also considered as the position of the first isolation portion 310. The central point $0_n(\varepsilon_n,\eta_n)$ of the first isolation portion 310 is taken as the position of the first isolation portion 310, and the light transmittance function $t_2(x_0,y_0)$ of the first isolation portion 310 is:

$$t_2(x_o, y_o) = t_g(x_o, y_o) * \sum_{n=1}^{N} \delta(x_o - \varepsilon_n, y_o - \eta_n) \tag{2}$$

A combined light transmittance function of the first isolation portion 310 and the pixel electrode 210 can be obtained from the above equations (1) and (2) as:

$$t_3(x_o, y_o) = \tag{3}$$

-continued $$t_c(x_o, y_o) * \sum_{n=1}^{N} \delta(x_o - \varepsilon_n, y_o - \eta_n) + t_g(x_o, y_o) * \sum_{n=1}^{N} \delta(x_o - \varepsilon_n, y_o - \eta_n)$$

That is:

$$t_3(x_o, y_o) = [t_c(x_o, y_o) + t_g(x_o, y_o)] * \sum_{n=1}^{N} \delta(x_o - \varepsilon_n, y_o - \eta_n) \quad (4)$$

According to the convolution theorem, the frequency spectrum of the display panel 10 can be obtained as:

$$T(f_x, f_y)_{total} = F[t_c(x_o, y_o) + t_g(x_o, y_o)] \times F[\delta(x_o - \varepsilon_n, y_o - \eta_n)] \quad (5)$$

in which F represents Fourier transform, $f_x = x/(\lambda \times z)$, $f_y = y/(\lambda \times z)$, $\lambda$ is the wavelength, and z is a distance from the pixel electrode 210 to the photosensitive component.

According to the Fraunhofer diffraction equation:

$$U(x, y)_{total} = \frac{1}{j\lambda z} \exp(j\lambda_Z) \exp\left[j\frac{k}{2z}(x^2 + y^2)\right] \times F[U(x_o, y_o)] \quad (6)$$

in which $k = 2\pi/\lambda$ and j is an imaginary number.

The light intensity of the position where the pixel electrode 210 is located is:

$$I(x, y) = \left(\frac{1}{\lambda z}\right)^2 |F[U(x_o, y_o)]|^2 = \left(\frac{1}{\lambda z}\right)^2 [T(f_x, f_y)_{total}]^2 = \left(\frac{1}{\lambda z}\right)^2 |F[t(x_o, y_o)_{total}]|^2 \quad (7)$$

The following equation may be further obtained:

$$I(x, y) = \left(\frac{1}{\lambda z}\right)^2 \left\{ F[t_c(x_o, y_o) + t_g(x_o, y_o)] \bullet F\left[\sum_{n=1}^{N} \delta(x_o - \varepsilon_n, y_o - \eta_n)\right] \right\}^2 \quad (8)$$

$$F[t_c(x_o, y_o) + t_g(x_o, y_o)] = \frac{t_c(x_o, y_o) * \sum_{n=1}^{N} \delta(x_o - \varepsilon_n, y_o - \eta_n)}{\left| \sum_{n=1}^{N} \exp[-j2\pi(f_x \varepsilon_n + f_y \eta_n)] \right|^2} \quad (9)$$

Finally, the light transmittance function $t_2(x_0, y_0)$ of the first isolation portion 310 may be obtained as:

$$t_2(x_o, y_o) = F^{-1}\left\{ \frac{t_1(x_o, y_o) * \sum_{n=1}^{N} \delta(x_o - \varepsilon_n, y_o - \eta_n)}{\left| \sum_{n=1}^{N} \exp[-j2\pi(f_x \varepsilon_n + f_y \eta_n)] \right|^2} \right\} - t_1(x_o, y_o) \quad (10)$$

in which $F^{-1}$ represents inverse Fourier transform, N is the number of the pixel electrodes 210, and $1 \le n \le N$.

In some optional embodiments, the corresponding relationships between the first isolation portions 310 and the pixel electrodes 210 are the same, that is, the first distances D1 corresponding to the various pixel electrodes 210 are the same, the light transmittance function $t_2(x_0, y_0)$ of the first isolation portion 310 may be adjusted by adjusting the extension thickness of the first isolation portion 310 along the thickness direction (direction Z in FIG. 3). The thickness and shape of the first isolation portion 310 and the first distance D1 may be adjusted to adjust the light transmittance function $t_2(x_0, y_0)$ of the first isolation portion 310. When the light transmittance function $t_2(x_0, y_0)$ of the first isolation portion 310 satisfies the above equation, the diffraction can be further reduced, thereby facilitating the photosensitive component to acquire light information.

Although the present application has been described with reference to the preferred embodiments, various modifications can be made thereto and components thereof can be replaced with their equivalents without departing from the scope of the present application. In particular, various technical features described in various embodiments can be combined in any manner as long as there is no structural conflict. The present application is not limited to the specific embodiments described herein, and includes all technical solutions that fall within the scope of the claims.

What is claimed is:

1. A display panel, comprising:

a base plate;

a pixel electrode layer arranged on the base plate and comprising a plurality of pixel electrodes distributed in an array; and a pixel definition layer located at a side of the pixel electrode layer away from the base plate, the pixel definition layer comprising a plurality of first isolation portions distributed at intervals, each of the first isolation portions being ring-shaped and surrounding and defining a pixel opening, and an edge of a first orthographic projection of the pixel electrode on the base plate being within a second orthographic projection of the first isolation portion on the base plate, wherein the display panel further comprises a plurality of light-emitting units emitting lights of different colors, each of the light-emitting units being located in one pixel opening, the second orthographic projection comprising second inner edges facing the pixel opening and second outer edges away from the pixel opening, the second outer edges enclosing an isolation area, and isolation areas where at least two light-emitting units emitting lights of a same color are located being of different sizes.

2. The display panel according to claim 1, wherein a light transmittance of the first isolation portion is equal to or less than 70%.

3. The display panel according to claim 1, wherein the pixel definition layer further comprises second isolation portions each filled between adjacent first isolation portions, and a light transmittance of the first isolation portion is less than a light transmittance of the second isolation portion.

4. The display panel according to claim 1, wherein the first isolation portion has a light transmittance ranging from 20% to 70%.

5. The display panel according to claim 1, wherein the first orthographic projection comprises first outer edges, for the first orthographic projection within the isolation area, a distance between the second outer edge and the first outer edge is a first distance D1 greater than 0, and first distances D1 corresponding to at least two of the pixel electrodes are different.

6. The display panel according to claim 5, wherein a plurality of the light-emitting units emitting lights of different colors are combined to form a repeating unit, a plurality of repeating units are distributed in an array in the display panel, and the first distances D1 corresponding to the light-emitting units in at least two of the repeating units are different.

7. The display panel according to claim 6, wherein the first distances D1 corresponding to the light-emitting units within the repeating unit are equal.

8. The display panel according to claim 6, wherein the first distances D1 corresponding to the light-emitting units in adjacent repeating units are different.

9. The display panel according to claim 5, wherein the first distances D1 corresponding to at least two light-emitting units emitting lights of a same color are different.

10. The display panel according to claim 9, wherein the first distances D1 corresponding to two adjacent light-emitting units emitting lights of a same color are different.

11. The display panel according to claim 1, wherein a plurality of the light-emitting units emitting lights of different colors are combined to form a repeating unit, a plurality of repeating units are distributed in an array in the display panel, and the isolation areas corresponding to the light-emitting units in at least two of the repeating units are of different shapes.

12. The display panel according to claim 11, wherein the isolation areas corresponding to the light-emitting units within the repeating unit are of a same shape.

13. The display panel according to claim 11, wherein the isolation areas corresponding to the light-emitting units in adjacent repeating units are of different shapes.

14. The display panel according to claim 1, wherein the isolation areas where at least two light-emitting units emitting lights of a same color are located are of different shapes.

15. The display panel according to claim 14, wherein the isolation areas where two adjacent light-emitting units emitting lights of a same color are located are of different shapes.

16. A display apparatus, comprising the display panel according to claim 1.

17. The display panel according to claim 1, wherein the first orthographic projections of the plurality of pixel electrodes on the base plate are of a same first shape, and the second orthographic projections of at least part of the plurality of first isolation portions on the base plate have a shape different from the first shape.

18. The display panel according to claim 1, wherein the second outer edge of at least one isolation portion of the plurality of isolation portions includes two sub-edges having different distances from the second inner edge of the at least one isolation portion, and the two sub-edges are centrally symmetric about the pixel opening corresponding to the at least one isolation portion.

* * * * *